(12) United States Patent
Chiang et al.

(10) Patent No.: US 11,990,578 B2
(45) Date of Patent: May 21, 2024

(54) LIGHT-EMITTING DIODE DISPLAY STRUCTURE AND LIGHT-EMITTING DIODE DISPLAY MODULE THEREOF

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Zhunan Township (TW)

(72) Inventors: Che Wen Chiang, Shenzhen (CN); Tsung Yi Su, Shenzhen (CN); Po Lun Chen, Shenzhen (CN)

(73) Assignees: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

( * ) Notice: Subject to any disclaimer, the term of this patent is extended or adjusted under 35 U.S.C. 154(b) by 435 days.

(21) Appl. No.: 17/483,134

(22) Filed: Sep. 23, 2021

(65) Prior Publication Data
US 2023/0058420 A1    Feb. 23, 2023

(30) Foreign Application Priority Data
Aug. 19, 2021  (CN) .......................... 202110955825.9

(51) Int. Cl.
H01L 27/15 (2006.01)
H01L 25/075 (2006.01)
H01L 31/12 (2006.01)
H01L 33/62 (2010.01)

(52) U.S. Cl.
CPC .......... *H01L 33/62* (2013.01); *H01L 25/0753* (2013.01)

(58) Field of Classification Search
CPC ... H01L 33/62; H01L 25/0753; G06F 3/0412; G06F 3/04164; G09F 9/33
USPC .......................................................... 257/79
See application file for complete search history.

(56) References Cited

U.S. PATENT DOCUMENTS 10,851,968 B2 * 12/2020 Miura ....................... F21V 5/04

* cited by examiner

*Primary Examiner* — Theresa T Doan
(74) *Attorney, Agent, or Firm* — Rosenberg, Klein & Lee (57) ABSTRACT

A LED display structure and its display module thereof are provided. The LED display module includes a LED array, a substrate disposed below the LED array, and at least one trace configuration layer, which is disposed below the LED array and adjacent to the substrate. The at least one trace configuration layer includes a plurality of wires, and a distribution density of the wires varies according to a distance between the wires and the LED array. When the distance increases, the distribution density of the wires is denser. Otherwise, the distribution density is sparse when the wires are closer to the LED array. In view of the simulation experimental analyses of the present invention, it is believed that at least 30% of the stray light ratio can be reduced so as to enhance the LED display structure with better transparency and image quality.

24 Claims, 11 Drawing Sheets

LIGHT-EMITTING DIODE DISPLAY STRUCTURE AND LIGHT-EMITTING DIODE DISPLAY MODULE THEREOF

This application claims priority of Application No. 202110955825.9 filed in Mainland China on 19 Aug. 2021 under 35 U.S.C. § 119; the entire contents of all of which are hereby incorporated by reference.

BACKGROUND OF THE INVENTION

Field of the Invention

The present invention is related to a screen display structure and its display module. More particularly, it is related to a light-emitting diode (LED) display structure and its display module, in which wires are characterized by having a varying distribution density.

Description of the Prior Art

In recent years, operational interfaces of informative products have been changed from traditional keyboards or mice to touch panels for inputting signals as the developments of information technologies, wireless communications, and information appliances are rapidly growing and brought into wide applications. And these operational interfaces are usually combined with display elements to form a common panel device. In general, the existing panel devices have been widely utilized in daily work and life and can be used to sense human fingers or other writing tools, such as stylus according to the sensing area provided upon the panel. As we know, a touch panel device can be alternatively fabricated into a resistive type, capacitive type, infrared type, surface acoustic type, and so on according to various mechanisms.

So far, it is well known that most of the capacitive-type touch panel devices use transparent conductive materials or metal meshes to form their sensing electrode patterns. Among them, since the production cost of transparent conductive materials such as indium tin oxide (ITO), indium zinc oxide (IZO) and aluminum zinc oxide (AZO) are relatively high, the processes for reducing their impedance are also difficult to proceed, and/or these processes are highly restricted to a lot of constraints, it is obvious that the transparent conductive materials can be hardly made into low impedance. And thus, it is believed that the transparent conductive materials nowadays, still fail to provide sufficient touch sensitivity of a touch panel device.

On the other hand, to replace the above-mentioned transparent conductive materials, metal meshes are then proposed as an alternative. Generally speaking, most of the common metal meshes are made of materials, such as silver or copper. Since the conductivity of metal is better than that of transparent conductive materials, the surface resistance can be reduced to less than 10 ohms. Although the metal, itself, is not as transparent as the transparent conductive material, nevertheless, light transmittance provided by grids of the metal meshes is comparatively better than that provided by the transparent conductive materials. In general, common metal mesh structures may include grid shapes, irregular filament shapes, etc., and in addition to its better light transmittance, metal mesh structures are also believed to have superior flexibility, which makes it an ideal substitute for the transparent conductive material. However, what still draws our attention is that, when the panel display device is applied practically and exposed to ambient light, the ambient light will be reflected by these sensing electrode patterns made of metal meshes and the reflected lights will be observed by users, so as to degrade the image quality and display effect of the panel display device. For instance, due to the above-mentioned structural characteristics, when light passes through metal meshes, the sensing electrode patterns made of metal meshes are most likely to have much higher reflective rate because of metal reflection. As a result, its image quality and display effect will be affected and even getting worse. Moreover, the commonly seen Moiré Effect will even be induced. Applicants believe that these are the major deficiencies of the current metal meshes which need to be faced and solved.

Figure 1:
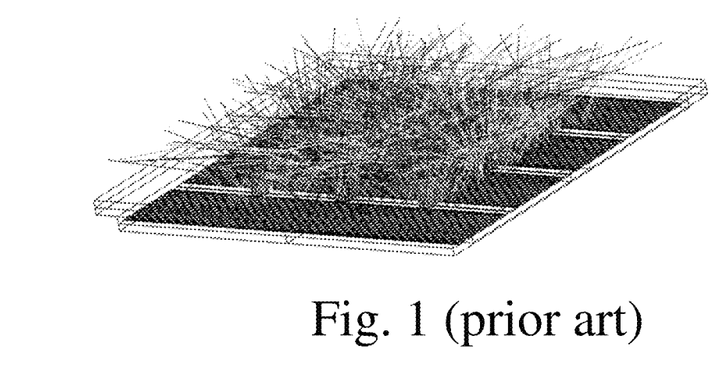
FIG. 1 and FIG. 2 schematically show simulation light tools of the stray light diagrams in a conventional panel display device when using metal meshes.
Figure 2:
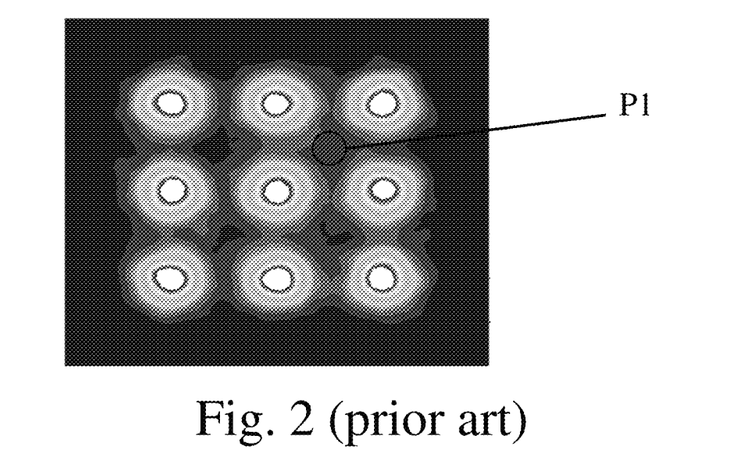
Figure 3:
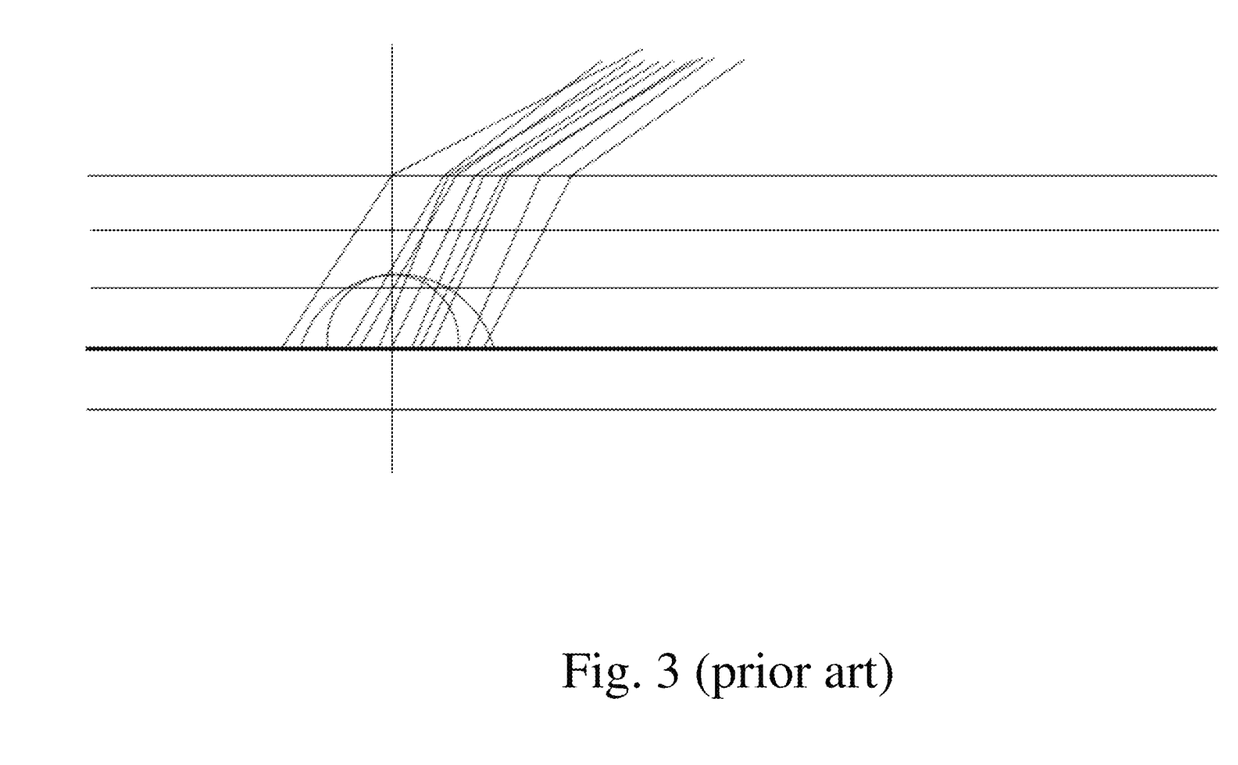
FIG. 3 schematically shows the conventional stray light ray path composed of the cross-talk interferences between light-emitting diodes (LEDs) in prior arts.
Figure 4:
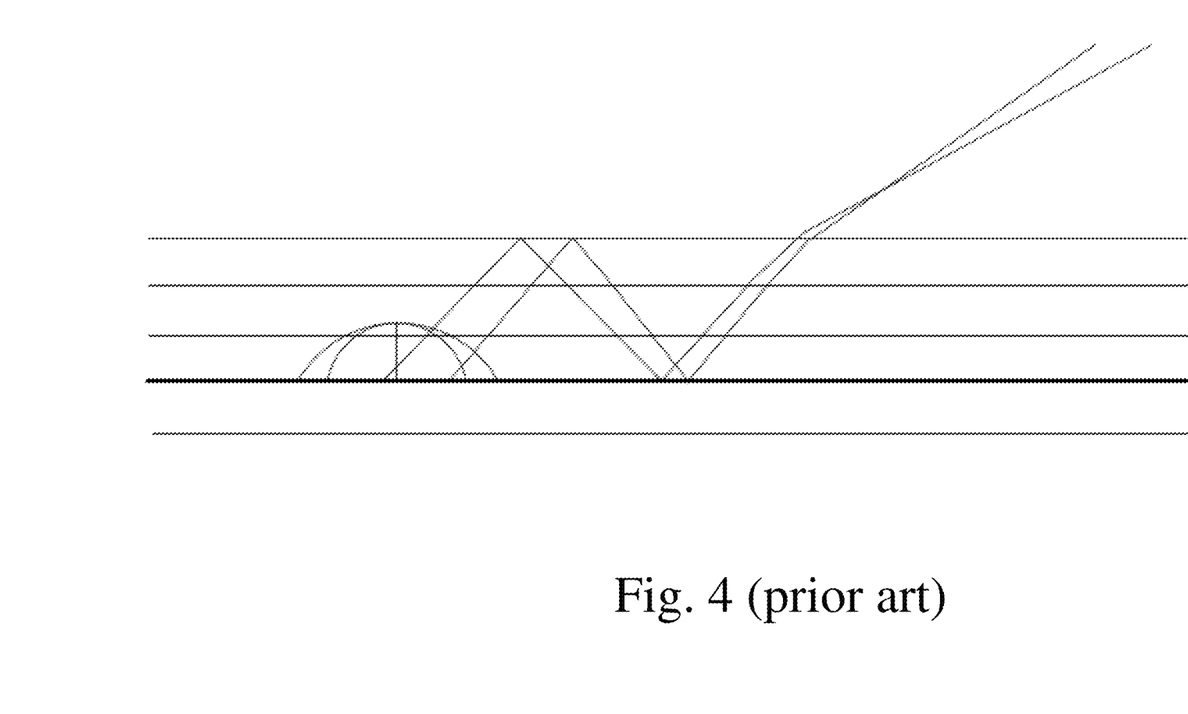
FIG. 4 schematically shows the conventional stray light ray path composed of the metal mesh reflection in prior arts.
Figure 5:
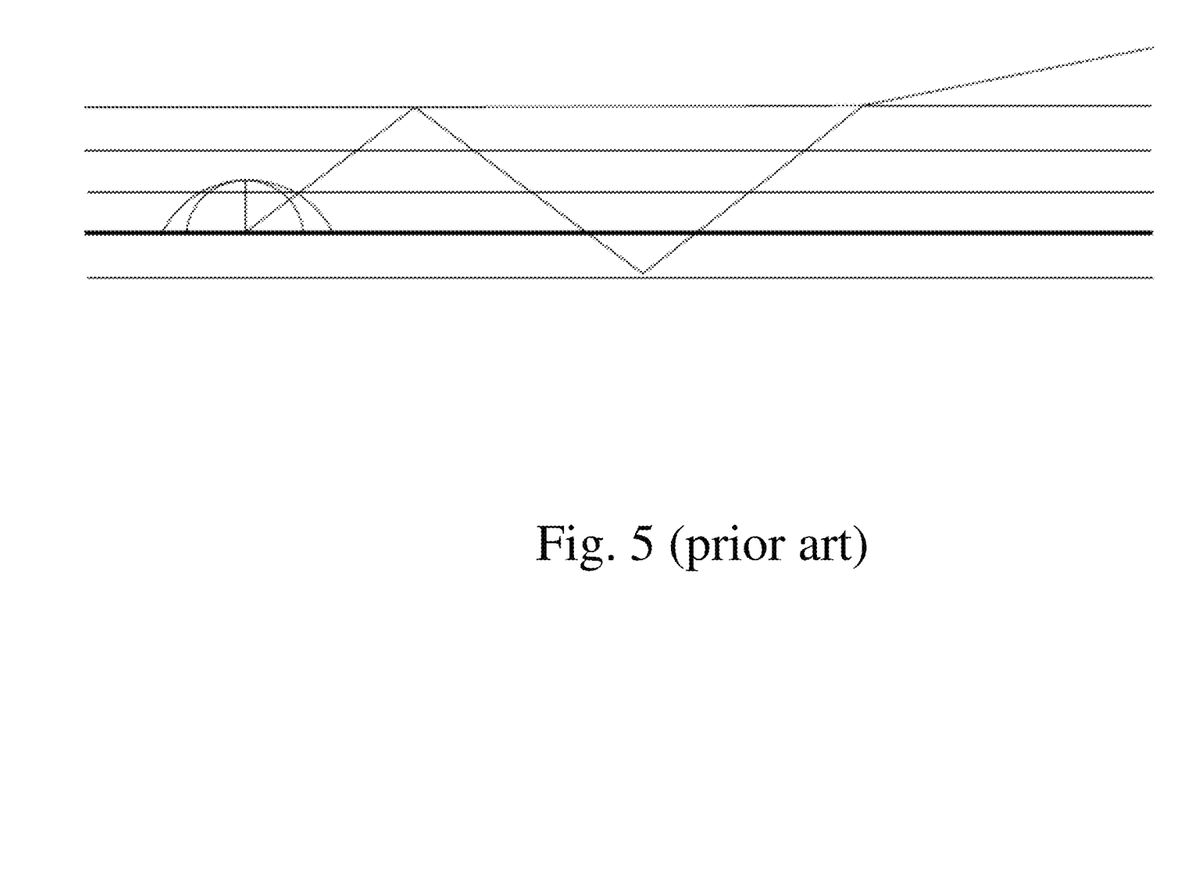
FIG. 5 schematically shows the conventional stray light ray path composed of the bottom reflection in prior arts.

In the following, please refer to FIG. 1 and FIG. 2, which schematically show simulation light tools of the stray light diagrams in a conventional panel display device when using metal meshes. A stray light analysis area is illustrated in FIG. 2 as in the circular area P1. To be more specific, the stray light ray paths are mainly composed of the cross-talk interferences between light-emitting diodes (LEDs) as shown in FIG. 3, the metal mesh reflection as shown in FIG. 4, and the bottom reflection as shown in FIG. 5. It is believed that the LEDs cross-talk interferences in FIG. 3 are usually generated due to large distribute angle of the LEDs. The metal mesh reflection in FIG. 4 is formed when the LED light goes to the top cover glass, be reflected back to the metal mesh, and reflected again to the top cover glass. And, the bottom reflection in FIG. 5 is formed when the LED light goes to the top cover glass, be reflected back to its bottom EVA layer, and reflected again to the top cover glass. Therefore, in view of these stray light analysis diagrams, it is apparent that the reflection issues exist inevitably when metal meshes are used, and the reflection further induces stray light problems, which in turn affects the display effect and image quality of a panel display device. For instance, blurred images and reduced transparency will thus be formed.

Therefore, on account of above, to overcome the above-mentioned problems, it should be obvious that there is indeed an urgent need for the professionals in the field for proposing a new and modified display structure to be developed and its display module thereof that can effectively solve the above-mentioned problems occurring in the prior design. And by using such novel structure, the long-standing deficiencies of many previous prior arts are effectively avoided so as to implement an optimization result of the present invention. Hereinafter, the detailed specific implementations will be fully described in the following paragraphs.

SUMMARY OF THE INVENTION

In order to overcome the above-mentioned disadvantages, one major objective in accordance with the present invention is provided for a novel light-emitting diode display module, which is aimed to modify the current display design in order to effectively reduce the stray light issues induced by metal reflection in the conventional metal meshes. By employing the proposed invention, it is advantageous of enhancing transparency and image quality of light-emitting diode display devices.

Another objective in accordance with the present invention is provided for a light-emitting diode display module in which its wires are characterized by having varying distribution density. As a result, by employing the proposed design techniques, the wires which are closer to the light source are designed to have a relatively sparse distribution density, and the wires which are farther away from the light source are designed to have a relatively dense distribution density. In view of the simulation results of the present invention provides, it is ensured that at least 30% of the stray light ratio can be reduced, thereby solving the conventional issues as discussed earlier in the prior arts.

In addition, and yet another objective in accordance with the present invention is provided for a panel display structure, in which the proposed light-emitting diode display module can be properly assembled with an adhesive layer, an optical bonding layer and a capping layer to form a light-emitting diode display structure with superior transparency and image quality. Besides, it is believed that the light-emitting diode display structure may also be further applied widely in touch sensing devices and its related fields, in combination with the touch function to enhance industrial efficiency and applicability of the present invention.

As a result, for achieving the above-mentioned objectives, the present invention is aimed to provide a light-emitting diode (LED) display module, comprising: a light-emitting diode (LED) array, a substrate, and at least one trace configuration layer. The substrate is disposed below the LED array. The at least one trace configuration layer is disposed below the LED array and adjacent to the substrate, wherein the at least one trace configuration layer includes a plurality of wires, and the plurality of wires have a varying distribution density. According to the present invention, the distribution density of the plurality of wires varies according to a distance between the plurality of wires and the LED array. As a result, when the distance increases, the distribution density of the plurality of wires is denser, and when the distance decreases, the distribution density of the plurality of wires is sparser.

In one embodiment of the present invention, the trace configuration layer can be disposed on an upper surface of the substrate. Alternatively, the trace configuration layer can also be disposed on a lower surface of the substrate. In a preferred embodiment of the present invention, the above-mentioned at least one trace configuration layer may also comprise a first trace configuration layer and a second trace configuration layer, which are respectively disposed on an upper surface of the substrate and on a lower surface of the substrate. In such an embodiment, the first trace configuration layer and the second trace configuration layer are allowed to have exactly the same distribution density, or have different distribution density. The present invention is definitely not limited to certain numerical value or distribution pattern of these distribution densities. Moreover, the disclosed trace configuration layer is designed to be able to provide electrical power or data input to the LED array. And, a material of the wires in the trace configuration layer can be configured as metal or non-metal, which are both effective in reducing reflected stray light as the invention.

According to the technical characteristics disclosed in the present invention, a line width of the plurality of wires of the at least one trace configuration layer is in a range between 2 μm and 70 μm.

Regarding the LED array, it is designed to comprise a plurality of light-emitting diodes (LED), and a spacing is formed between each of the plurality of LEDs. According to the embodiment of the present invention, the spacing is greater than 1 mm. As a result, based on the design manner, when the distance between the plurality of wires and the LED array is less than one quarter of the spacing, the distribution density of the plurality of wires is designed to be relatively sparser.

On the other hand, when the distance between the plurality of wires and the LED array is in a range between one quarter of the spacing and one half of the spacing, then the distribution density of the plurality of wires can be designed to be relatively denser.

Therefore, it is obvious that the present invention adopts the varying wire-distribution density to control the wires which are closer to the light source to have a sparser distribution density, and those wires which are farther away from the light source to have a denser distribution density. From the simulation results, it proves that the present invention succeeds in reducing at least 30% of the stray light ratio, and the existing problems in the prior arts are believed to be solved.

And in another aspect, the present invention further provides a light-emitting diode (LED) display structure based on the foregoing LED display module, in which the LED display structure includes the LED display module, an adhesive layer disposed on the LED display module, an optical bonding layer disposed on the adhesive layer, and a capping layer disposed on the optical bonding layer.

Specifically, the LED display module includes a LED array, a substrate, and at least one trace configuration layer. The substrate is disposed below the LED array. The at least one trace configuration layer is disposed below the LED array and adjacent to the substrate, wherein the at least one trace configuration layer includes a plurality of wires, and the plurality of wires have a varying distribution density. According to the present invention, the distribution density of the plurality of wires varies according to a distance between the plurality of wires and the LED array. As a result, when the distance increases, the distribution density of the plurality of wires is denser. Otherwise, when the distance decreases, the distribution density of the plurality of wires is sparser.

By employing such design rules, the LED display structure and display module thereof are characterized by having a varying distribution density of wires, such that a relatively sparse distribution density is applied to the wires which are closer to the light source, and a relatively dense distribution density is applied to the wires which are farther away from the light source. As a result, when compared with the prior art, in which the conventional metal meshes can only have uniform wire distribution density, it is apparent that the present invention is able to dynamically adjust its wire distribution density according to the distance between the wires and the light source, so as to successfully improve the various shortcomings in the existing prior arts. It is guaranteed that at least 30% of the stray light can be eliminated by employing the proposed technical solutions provided by the present invention.

In the following descriptions, these and other objectives of the present invention will become obvious to those of ordinary skill in the art after reading the following detailed description of preferred embodiments.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

As the foregoing shortcomings which have been described in the previous prior arts, including the blurred images and reduced transparency due to the stray light issue caused by reflection from the metal meshes, some of the existing technology also propose to perform certain patterning processes of grids of the metal meshes for avoiding the Moiré Effect, wherein the patterning processes may include forming the metal grids into diamond-shapes, square-shapes, honeycomb-shapes, or irregular-shapes. In addition, hollow regions (such as breakpoints) may also be formed in the metal grids. However, considering the process conditions when it is undesirable, then short circuit will be easy to form at the breakpoints. Moreover, additional parasitic capacitance in certain areas will also be generated. Apart from these, since the existing breakpoint design is usually allowed to have a length of 1.5 to 15 µm, when light passes through the breakpoints, serious Moiré Effect still happens, and thus still being not helpful enough.

Figure 6:
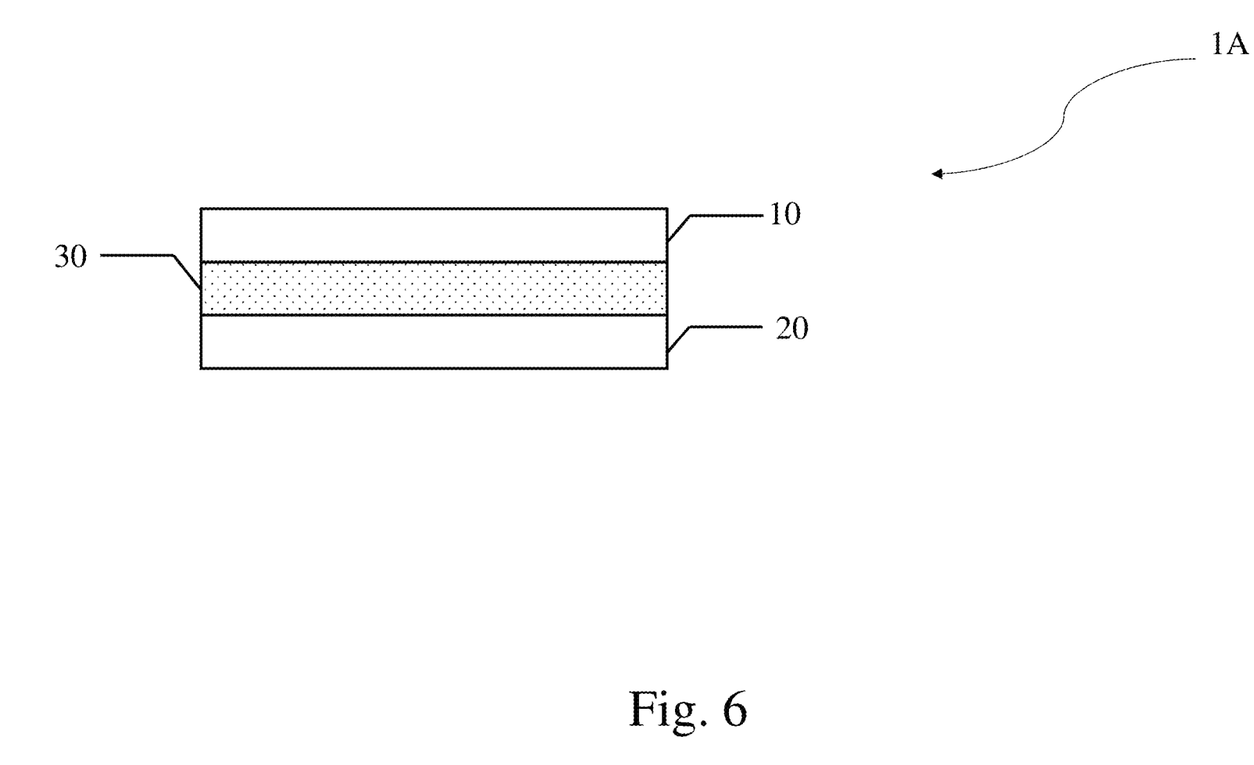
FIG. 6 shows a structural diagram of a light-emitting diode (LED) display module in accordance with a first embodiment of the present invention.
Figure 7:
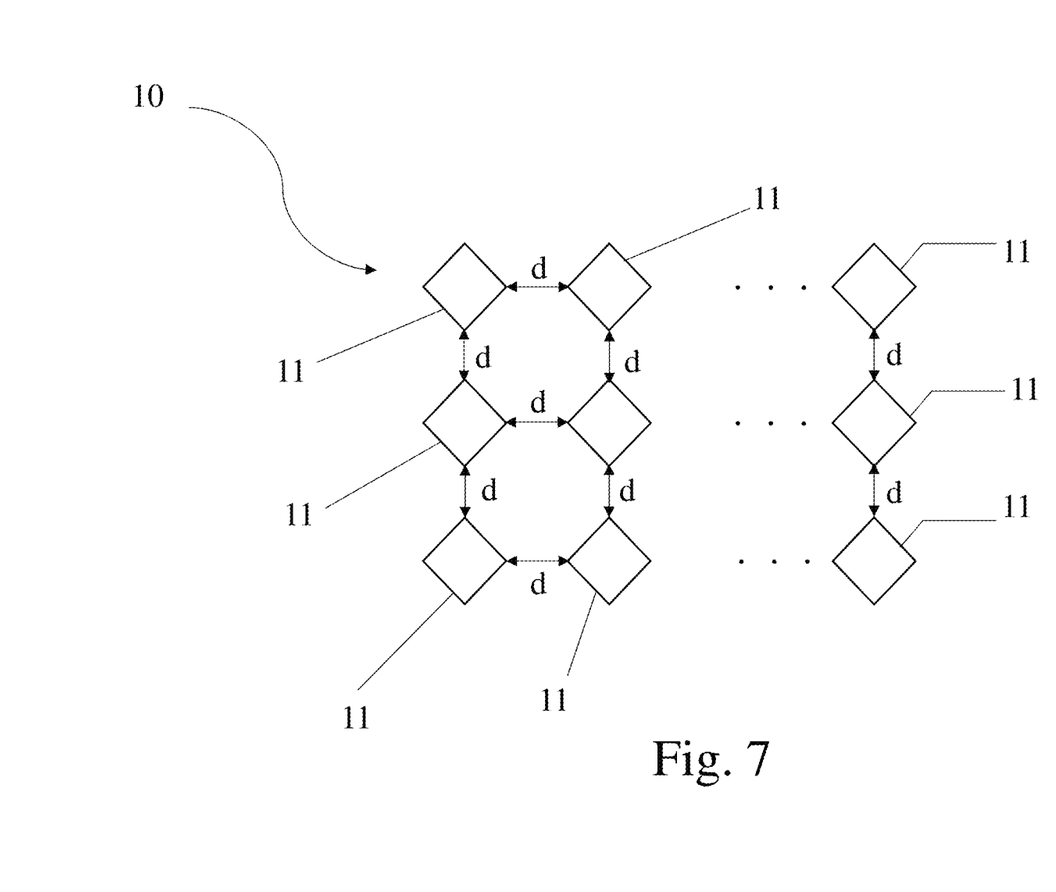
FIG. 7 shows a detailed illustration of the LED array of the light-emitting diode (LED) display module in accordance with the embodiment of the present invention.

Therefore, based on the above-mentioned problems to be solved, the present invention is aimed to provide a modified design scheme, which is shown in FIG. 6 illustrating a structural diagram of a light-emitting diode (LED) display module in accordance with a first embodiment of the present invention. The LED display module 1A includes a light-emitting diode (LED) array 10. A detailed illustration of the LED array 10 is shown in FIG. 7, in which the LED array 10 comprises a plurality of light-emitting diodes (LED) 11, and a spacing d is formed between each of the plurality of LEDs 11. According to the embodiment of the present invention, the disclosed spacing d is greater than 1 mm.

Figure 8:
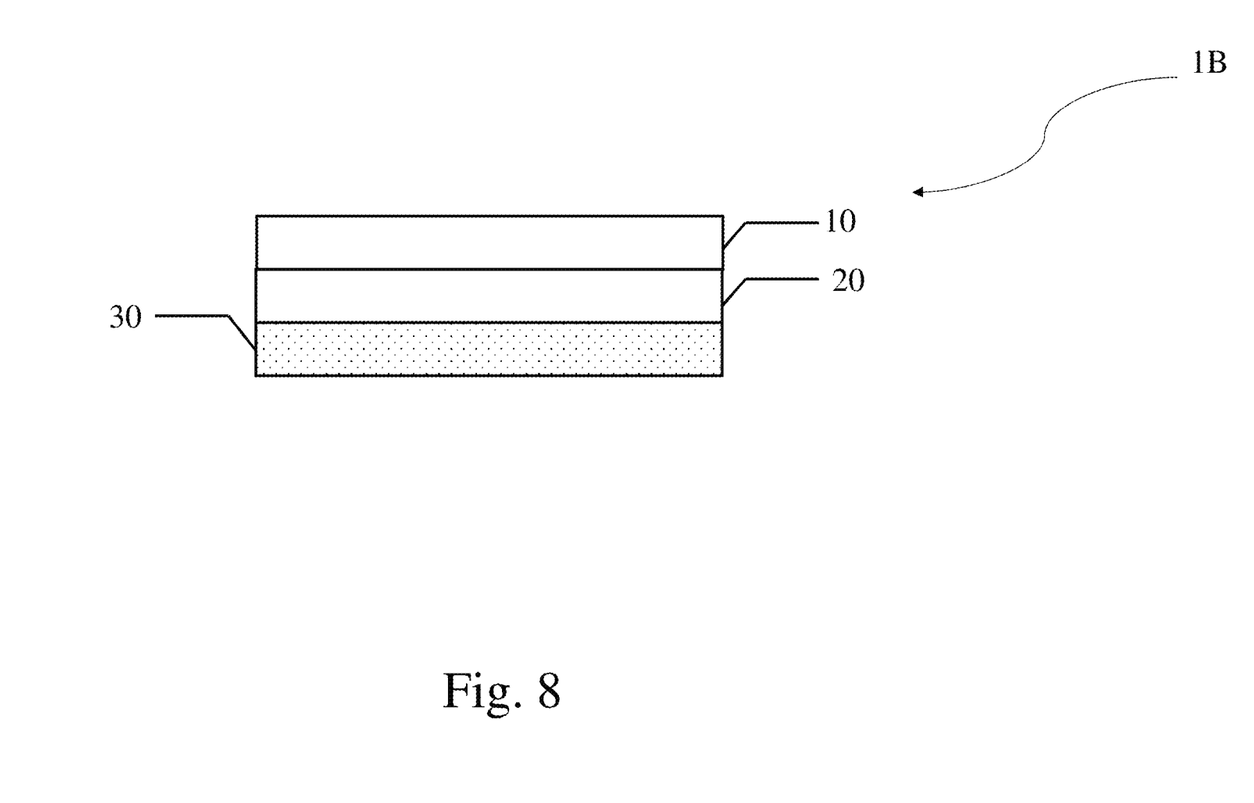
FIG. 8 shows a structural diagram of a light-emitting diode (LED) display module in accordance with a second embodiment of the present invention.
Figure 9:
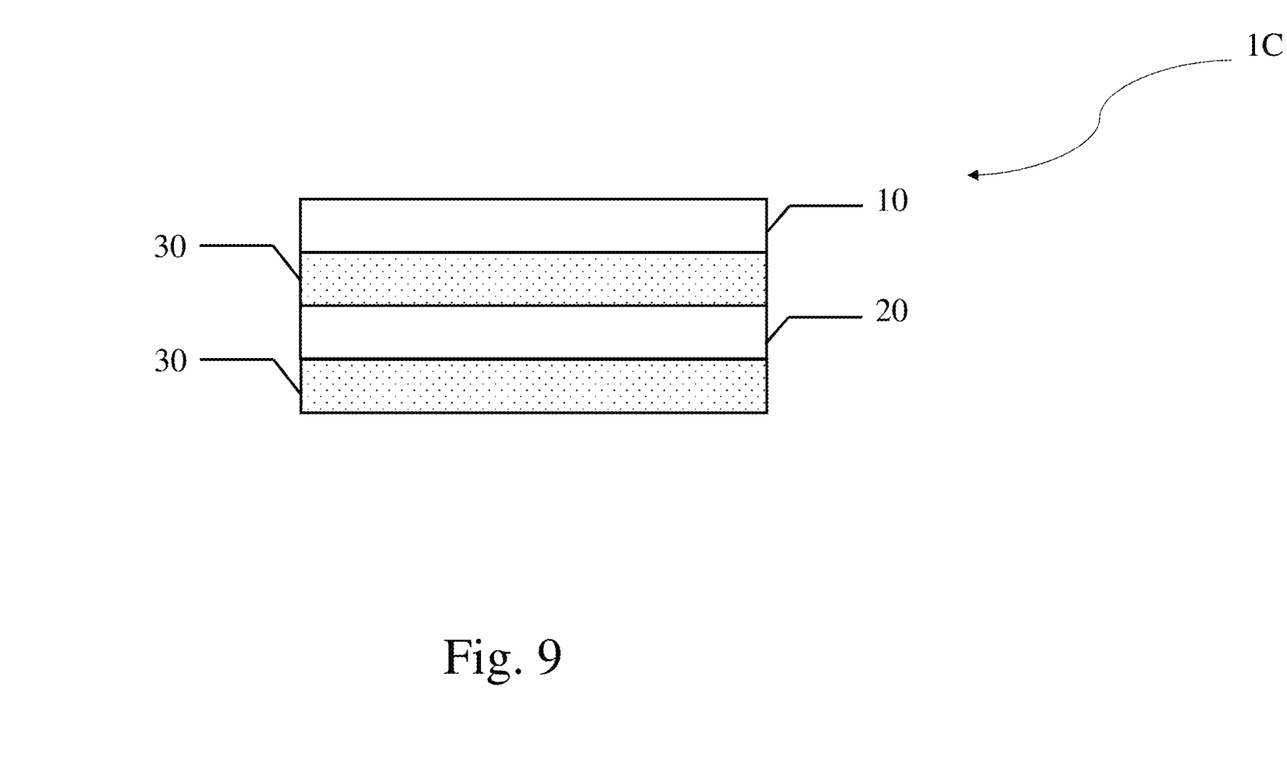
FIG. 9 shows a structural diagram of a light-emitting diode (LED) display module in accordance with a third embodiment of the present invention.

As referring to FIG. 6, it can be seen that a substrate 20 is disposed below the LED array 10. According to the embodiment of the present invention, the material of the substrate 20 for example, can be and yet not limited to, polyester (PET) or colorless polyimide (CPI). A trace configuration layer 30 is disposed below the LED array 10 and adjacent to the substrate 20. For fully explaining the technical features of the present invention in details, the first embodiment of the present invention is described as providing the trace configuration layer 30 on an upper surface of the substrate 20 as an illustrative embodiment. However, in other embodiments of the present invention, for example, in FIG. 8 which shows another structural diagram of the light-emitting diode (LED) display module in accordance with a second embodiment of the present invention, then the trace configuration layer 30 of the LED display module 1B can be also alternatively disposed on a lower surface of the substrate 20. Moreover, according to a third embodiment of the present invention as illustrated in FIG. 9, then the LED display module 1C may also include more than one trace configuration layer 30, which are a first trace configuration layer and a second trace configuration layer, each respectively disposed on an upper surface of the substrate 20 and on a lower surface of the substrate 20 (will be described precisely in the following paragraphs). Overall, for those who are skilled in the art and having general knowledge backgrounds, appropriate modifications and/or variations with respective to the technical contents disclosed in the present invention without departing from the spirits of the present invention are allowed. However, it is worth noting that the modifications or variations should still fall into the scope of the present invention. The present invention is certainly not restricted by the certain limited configurations disclosed in the embodiments of the present invention.

According to the proposed technical solution of the present invention, the proposed trace configuration layer 30 includes a plurality of wires, and a distribution density of the plurality of wires varies based on a sophisticated design of the invention. Please find FIG. 10 for showing how the distribution density of the wires in the LED display module varies in accordance with the embodiment of the present invention. From the drawing, it is obvious that the distribution density of the wires varies according to a distance between the wires and the LED array 10. In general, the present invention proposes to design that the distribution density of the wires of the trace configuration layer 30 is sparser when the distance between the wires and the LED array decreases (as shown in the region 81), and the distribution density of the wires of the trace configuration layer 30 is denser when the distance between the wires and the LED array 10 increases (as shown in the region 83).

To be more specific, regarding the above-mentioned "distance" between the wires and the LED array, it is defined according to the planar distance on the X-Y plane between the wires and the LED array. For example, as illustrating in FIG. 10, when the distance ΔX between the wires of the trace configuration layer 30 and the LED array 10 is less than one quarter of the spacing "d" (see FIG. 7, "d" is the spacing between each LED 11), indicating that ΔX<d/4, then these wires are defined as "close" to the LED array 10. In this case, the present invention proposes to design these wires to have a relatively sparse distribution density.

Figure 10:
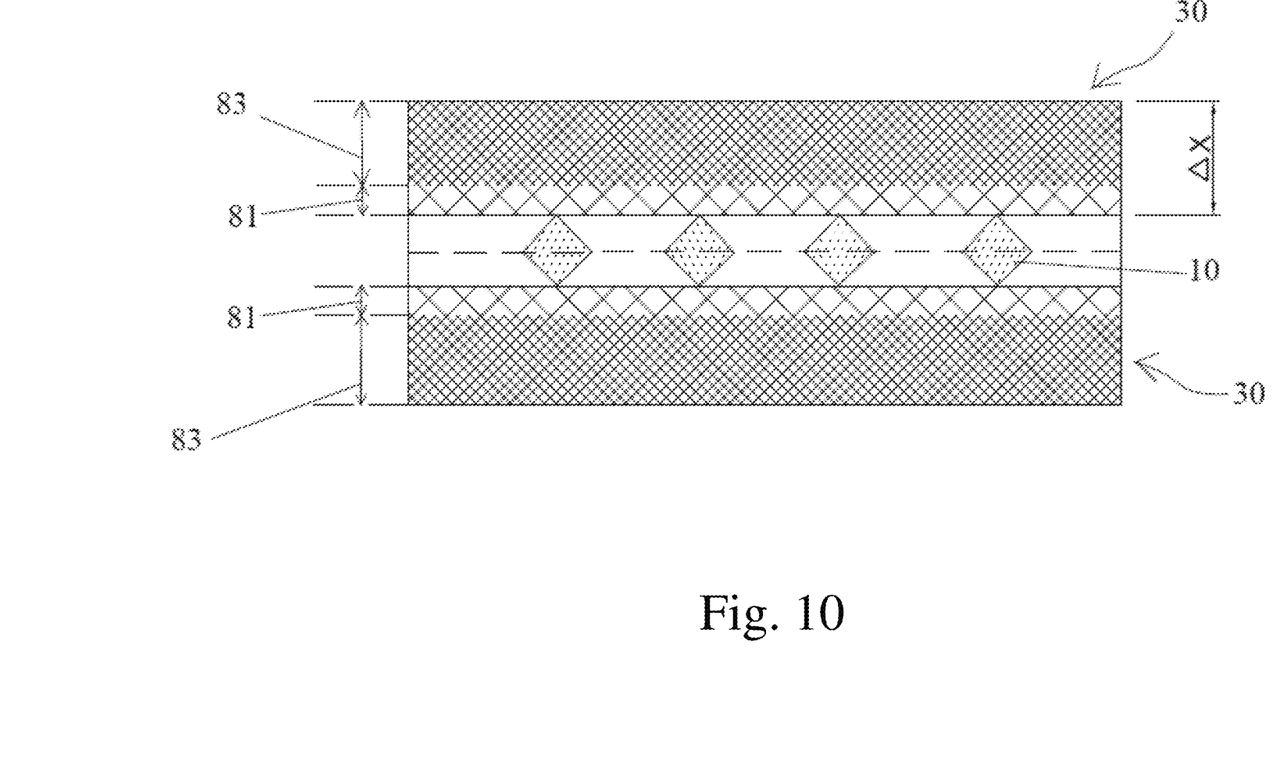
FIG. 10 schematically shows a drawing of the wires of the trace configuration layer having varying distribution density in accordance with the embodiment of the present invention.

In comparison, when the distance ΔX between the wires of the trace configuration layer 30 and the LED array 10 is in a range between one quarter of the spacing "d" and one half of the spacing "d", indicating that d/4<ΔX<2/d, then these wires are defined as "far away" from the LED array 10. And in this case, the present invention proposes to design these wires to have a relatively dense distribution density.

Figure 11:
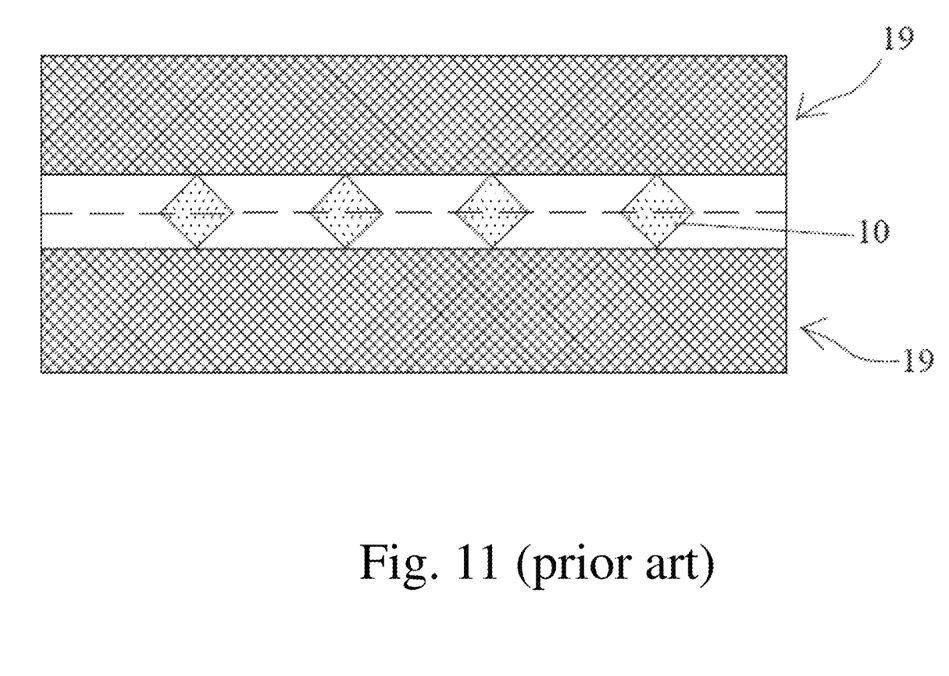
FIG. 11 schematically shows a drawing of the conventional metal meshes having uniform distribution density in a prior panel display device.

Furthermore, please also refer to FIG. 11 which schematically shows a drawing of the conventional metal meshes having uniform distribution density in a prior panel display device, wherein the conventional metal meshes 19 are equally spaced apart from each other and have a uniform distribution density. In the following, the applicant further performs stray light simulation experiments based on these two different metal meshes schemes as illustrated in FIG. 10 and FIG. 11, which are the varying distribution density proposed by the present invention (FIG. 10) and the traditional uniform distribution density in the prior art (FIG. 11), respectively. And thus, from the stray light simulation results and analyses, it can be obtained that a stray light ratio of the present invention (varying distribution density) to the prior art (uniform distribution density) is approximately approaching 70%. In other words, it is believed that by employing the proposed technical solution of the present invention as designing the wires to have varying distribution density, at least 30% of the stray light caused by the metal reflection can be effectively reduced, so as to prove the feasibility of the technical solution disclosed in the present invention and its superior invention effect that can be achieved.

In another aspect, since it is known that a wide line width of the wire may also induce reflection problems, a certain blacking process can be carried out on the metal wires or metal meshes to avoid the reflection. However, it still draws our attention that the blacking metal meshes or grids will affect the display quality and make the shown image darker. As a result, such blacking process is still not practical enough, especially when bright colors and vivid display effect are required. Therefore, the present invention is further aimed to design a line width of the wire in the trace configuration layer to be in a range between 2 μm and 70 μm, preferably about 4 μm, to effectively eliminate reflection problems without sacrificing its image quality.

Moreover, the applicant further provides technical contents of applying the proposed LED display module to form a light-emitting diode (LED) display structure in the following paragraphs. Please refer to FIG. 12 for a structural diagram of the light-emitting diode (LED) display structure in accordance with an embodiment of the present invention. The LED display structure 100 includes a light-emitting diode (LED) display module 1D, an adhesive layer 202, an optical bonding layer 204 and a capping layer 206. What makes the LED display module 1D here in the LED display structure different from the previous LED display module 1A in FIG. 6 is that, the LED display module 1D comprises the LED array 10, the substrate 20 and two trace configuration layers 30, wherein one trace configuration layer 30 (a first trace configuration layer) is disposed on an upper surface of the substrate 20, and the other trace configuration layer 30 (a second trace configuration layer) is disposed on a lower surface of the substrate 20. Each the trace configuration layer 30 includes a plurality of wires, and a distribution density of the plurality of wires varies according to a distance between the plurality of wires and the LED array as we have explained earlier in the invention as illustrated in FIG. 10. As such, when the wires are closer to the LED array 10, indicating that the distance decreases, then the distribution density of the plurality of wires is sparser, and when the wires are farther away from the LED array 10, indicating that the distance increases, then the distribution density of the plurality of wires will be denser.

Figure 12:
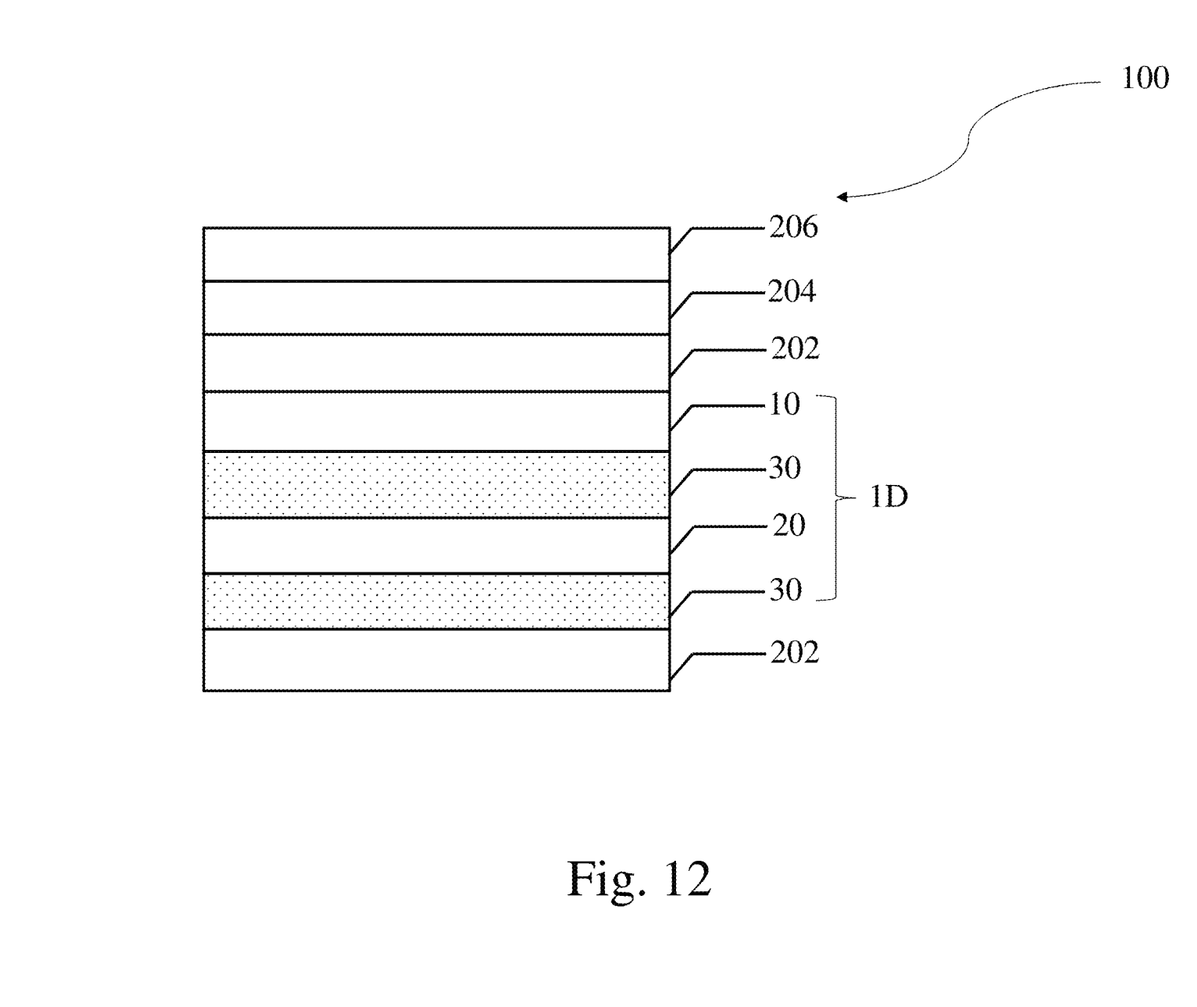
FIG. 12 shows a structural diagram of the light-emitting diode (LED) display structure in accordance with one embodiment of the present invention.

It is worth asserting that, since two trace configuration layers 30 are respectively disposed on an upper surface and a lower surface of the substrate 20 in such embodiment, and each trace configuration layer 30 is designed and controlled to have a varying distribution density, it is believed that as long as the relatively sparse distribution density is applied to the wires in the trace configuration layers 30 which are close to the LED array 10, and the relatively dense distribution density is applied to the wires in the trace configuration layers 30 which are far away from the LED array 10, reflected stray light can be effectively suppressed by employing the proposed invention. That is to say, the present invention is certainly not limited to specific value of the wire distribution density of the trace configuration layer 30. In other words, according to the present invention, the distribution density of the wires in each of the trace configuration layers 30 can be the same. Alternatively, the distribution density of the wires in each of the trace configuration layers 30 may also be different. The present invention is not limited by the numerical value or design pattern of such wire distribution density. And those skilled in the art and/or designers, developers of panel display devices are allowed to make variations themselves according to practical product requirements without departing from the spirits of the present invention, and yet it is conformed that the variations should still fall into the scope of the invention with equality.

In addition, according to the embodiment of the present invention, the proposed trace configuration layer 30 is designed to be able to provide electrical power or data input to the LED array 10. As a result, it also further helps to reduce the usage and density of conventional metal wires. Meanwhile, optical and/or electrical performance targets can also be accomplished.

As can be seen in FIG. 12, one adhesive layer 202 is disposed on the LED array 10 of the light-emitting diode display module 1D. And when the trace configuration layer 30 is also disposed on the lower surface of the substrate 20, a bottom of the trace configuration layer 30 is further provided with a second adhesive layer 202. An optical bonding layer 204 is disposed on the upper adhesive layer 202, and a capping layer 206 is disposed on the optical bonding layer 204 so as to seal the entire light-emitting diode display structure 100.

In one embodiment of the present invention, a material of the capping layer 206, for instance, can be cover glass (CG), and a material of the optical bonding layer 204, for instance, can be optical clear adhesive (OCA).

As for the adhesive layer 202, it can be, for example, composed of natural rubber or synthetic rubber, which is made of ethylene vinyl acetate (EVA) copolymer formed by copolymerization of ethylene (E) and vinyl acetate (VA). Generally, as we know, the EVA copolymer is characterized by well flexibility and elasticity like rubber, and can still show good flexibility, transparency and surface gloss even at −50° C. In addition, the EVA copolymer has superior chemical stability, anti-aging and ozone resistant properties, and it is non-toxic. Since the EVA copolymer is in a solid state at room temperature and can be melted to flow (in a liquid state) and has a certain viscosity when being heated, it has been widely used as an ideal thermoplastic material in the panel display structure for thermal bonding.

Besides, regarding materials for fabricating wires of the proposed trace configuration layer 30 in the present invention, it is evident that metal can be used. However, according to alternative embodiments of the present invention, then the wires of the trace configuration layer 30 may also be made of non-metal materials for reducing the stray light. Since the commonly known wires are usually made of metal to form metal meshes, unavoidable chemical reactions, such as oxidation, often occur on top of the metal surface when in storage or even in a manufacturing process. In addition, under some circumstances, it is even possibly to react with certain acidic substances and/or alkaline substances to generate its conductivity loss. As a result, for solving these foregoing issues, the present invention further proposes to use non-metal materials for fabricating wires of the trace configuration layer 30 so as to further enhance the developments and industrial applicability of the present invention.

Therefore, on account of the above-disclosed technical contents of the present invention, it is obvious that the present invention is aimed to provide a certain kind of varying distribution density of the wires in the trace configuration layer, such that the wires which are closer to the light source have sparser distribution density, and the wires which are farther away from the light source have denser distribution density. By employing the design manners, the present invention achieves to effectively solve the conventional shortcomings of severe stray light issues and poor display quality caused by reflected lights. Moreover, according to the proposed varying distribution density of the wires in the trace configuration layer, it is applicable to dispose the trace configuration layer on either one surface of the substrate, or on both upper and lower surfaces of the substrate. When both the upper and lower surfaces of the substrate are provided with the trace configuration layer, the wire distribution density of each of the trace configuration layer can also be different, in order to meet and comply with requirements and diversities of different devices. Moreover, wires of the trace configuration layer can be made of metal or non-metal so as to further improve the applicability of the present invention and thus be able to widely meet up with a variety of market demands.

Therefore, based on at least one embodiment provided above, it is believed that, when compared to the prior arts, it is obvious that the light-emitting diode display structure and light-emitting diode display module thereof disclosed by the present invention is effective in solving the existing problems occurring in the prior arts. According to the proposed technical solutions in the present invention, it is believed that at least 30% of the stray light ratio generated due to the metal reflection in conventional mental meshes can be reduced. As a result, the LED display structure is improved to show a much better transparency and image quality than ever.

It is still worth emphasizing that overall, it is believed that for people who are skilled in the art and having understandings and technical backgrounds to the present invention, it would be allowed for them to make various modifications or changes depending on different device requirements and/or specifications without departing from the scope of the invention. That is to say, the present invention is certainly not limited thereto.

And yet furthermore, according to the light-emitting diode display module disclosed in the present invention, it can also be widely applied to display devices that are not limited to use LED as its lighting source. The present invention can be applied in a variety of technical fields other than the light-emitting diodes. The present invention is not limited thereto.

As a result, to sum above, it is obvious that the present invention apparently shows much more effective performances than before. In addition, it is believed that the present invention is instinct, effective and highly competitive for technologies and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:
1. A light-emitting diode display module, comprising:
a light-emitting diode (LED) array;
a substrate, disposed below the LED array; and
at least one trace configuration layer, which is disposed below the LED array and adjacent to the substrate, wherein the at least one trace configuration layer includes a plurality of wires, and a distribution density of the plurality of wires varies according to a distance between the plurality of wires and the LED array, such that when the distance increases, the distribution den- sity of the plurality of wires is denser, and when the distance decreases, the distribution density of the plurality of wires is sparser.

2. The light-emitting diode display module according to claim 1, wherein the at least one trace configuration layer is disposed on an upper surface of the substrate.

3. The light-emitting diode display module according to claim 1, wherein the at least one trace configuration layer is disposed on a lower surface of the substrate.

4. The light-emitting diode display module according to claim 1, wherein the at least one trace configuration layer comprises a first trace configuration layer and a second trace configuration layer, which are respectively disposed on an upper surface of the substrate and on a lower surface of the substrate.

5. The light-emitting diode display module according to claim 4, wherein the distribution density of the plurality of wires of the first trace configuration layer and the distribution density of the plurality of wires of the second trace configuration layer are different.

6. The light-emitting diode display module according to claim 1, wherein the at least one trace configuration layer provides electrical power or data input to the LED array.

7. The light-emitting diode display module according to claim 1, wherein the plurality of wires of the at least one trace configuration layer is made of metal.

8. The light-emitting diode display module according to claim 1, wherein the plurality of wires of the at least one trace configuration layer is made of non-metal.

9. The light-emitting diode display module according to claim 1, wherein a line width of the plurality of wires of the at least one trace configuration layer is in a range between 2 μm and 70 μm.

10. The light-emitting diode display module according to claim 1, wherein the LED array comprises a plurality of light-emitting diodes (LED), a spacing is formed between each of the plurality of LEDs, and the spacing is greater than 1 mm.

11. The light-emitting diode display module according to claim 10, wherein when the distance between the plurality of wires and the LED array is less than one quarter of the spacing, the distribution density of the plurality of wires is sparser.

12. The light-emitting diode display module according to claim 10, wherein when the distance between the plurality of wires and the LED array is in a range between one quarter of the spacing and one half of the spacing, the distribution density of the plurality of wires is denser.

13. A light-emitting diode display structure, comprising:
a light-emitting diode display module, comprising:
a light-emitting diode (LED) array;
a substrate, disposed below the LED array; and
at least one trace configuration layer, which is disposed below the LED array and adjacent to the substrate, wherein the at least one trace configuration layer includes a plurality of wires, and a distribution density of the plurality of wires varies according to a distance between the plurality of wires and the LED array, such that when the distance increases, the distribution density of the plurality of wires is denser, and when the distance decreases, the distribution density of the plurality of wires is sparser;
an adhesive layer, disposed on the LED array of the light-emitting diode display module;
an optical bonding layer, disposed on the adhesive layer; and
a capping layer, disposed on the optical bonding layer.

14. The light-emitting diode display structure according to claim 13, wherein the adhesive layer is made of thermoplastic material.

15. The light-emitting diode display structure according to claim 13, wherein the at least one trace configuration layer provides electrical power or data input to the LED array.

16. The light-emitting diode display structure according to claim 13, wherein the at least one trace configuration layer is alternatively disposed on an upper surface of the substrate or on a lower surface of the substrate.

17. The light-emitting diode display structure according to claim 16, wherein when the at least one trace configuration layer is disposed on the lower surface of the substrate, a bottom of the at least one trace configuration layer is further provided with a second adhesive layer.

18. The light-emitting diode display structure according to claim 13, wherein the at least one trace configuration layer comprises a first trace configuration layer and a second trace configuration layer, which are respectively disposed on an upper surface of the substrate and on a lower surface of the substrate.

19. The light-emitting diode display structure according to claim 18, wherein the distribution density of the plurality of wires of the first trace configuration layer and the distribution density of the plurality of wires of the second trace configuration layer are different.

20. The light-emitting diode display structure according to claim 13, wherein the plurality of wires of the at least one trace configuration layer is made of metal or non-metal.

21. The light-emitting diode display structure according to claim 13, wherein a line width of the plurality of wires of the at least one trace configuration layer is in a range between 2 μm and 70 μm.

22. The light-emitting diode display structure according to claim 13, wherein the LED array comprises a plurality of light-emitting diodes (LED), a spacing is formed between each of the plurality of LEDs, and the spacing is greater than 1 mm.

23. The light-emitting diode display structure according to claim 22, wherein when the distance between the plurality of wires and the LED array is less than one quarter of the spacing, the distribution density of the plurality of wires is sparser.

24. The light-emitting diode display structure according to claim 22, wherein when the distance between the plurality of wires and the LED array is in a range between one quarter of the spacing and one half of the spacing, the distribution density of the plurality of wires is denser.

* * * * *